United States Patent [19]

Kyoo

[11] Patent Number: 4,875,570
[45] Date of Patent: Oct. 24, 1989

[54] APPARATUS FOR TRANSFERRING A LITHOGRAPHIC PLATE

[75] Inventor: Takatsugu Kyoo, Iruma, Japan

[73] Assignee: Tusbakimoto Chain Co., Japan

[21] Appl. No.: 189,425

[22] Filed: May 2, 1988

[30] Foreign Application Priority Data

Jul. 30, 1987 [JP] Japan .............................. 62-115844[U]

[51] Int. Cl.$^4$ ............................................. B65G 15/10
[52] U.S. Cl. ..................................... 198/408; 198/627; 198/817; 198/485.1
[58] Field of Search ...................... 198/627, 817, 485.1, 198/486.1, 487.1, 406, 408, 409

[56] References Cited

U.S. PATENT DOCUMENTS

| 2,682,946 | 7/1954 | King | 198/486.1 X |
| 4,602,774 | 7/1986 | Kobler | 198/627 X |
| 4,605,212 | 8/1986 | Kobler | 198/485.1 X |
| 4,712,361 | 12/1987 | Oberoi | 198/627 X |

FOREIGN PATENT DOCUMENTS 0711217 6/1954 United Kingdom ............. 198/486.1

Primary Examiner—Robert J. Spar
Assistant Examiner—D. Glenn Dayoan
Attorney, Agent, or Firm—Steele, Gould & Fried

[57] ABSTRACT

Apparatus for transferring a lithographic plate (S) from a horizontal conveyor (10) to an overhead conveyor (14) comprises has an elevator (19) in the form of a pair of endless chains (20) travelling around an endless vertical path. The chains (20) carry opposed hooks (22) for engaging a folded end portion (S1) of a lithographic plate and supporting the plate therebetween as the chain conveys the plate to a plate bed (24) on which the plate is deposited and which presents the plates to the overhead conveyor. Guide rails (23) are provided for guiding the hooks apart as the plate is deposited on the plate bed. A pair of elevators (19) may be provided to supply the lithographic plate to either one of a pair of overhead conveyors (14) depending upon the orientation with which the plate is supplied to the apparatus.

6 Claims, 5 Drawing Sheets

FIG.1
FIG.2
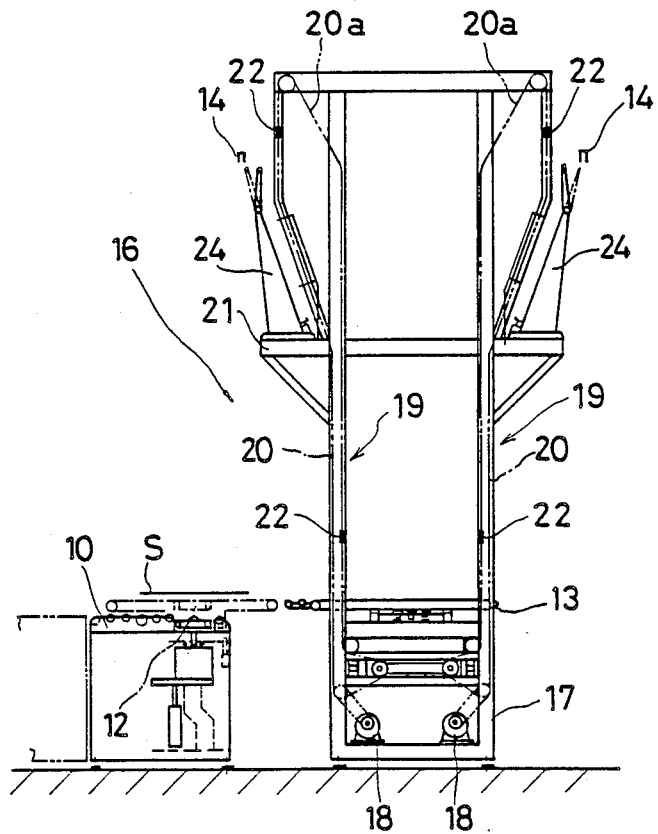
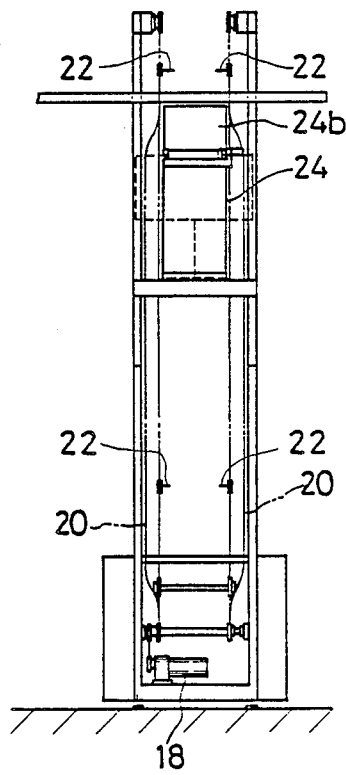

APPARATUS FOR TRANSFERRING A LITHOGRAPHIC PLATE

BACKGROUND OF THE INVENTION

1. Field of the Invention

This invention relates to an apparatus for transferring a lithographic plate from a horizontal conveyor to an overhead conveyor in the course of transporting lithorgraphic plates used for printing newspaper and the like.

2. Prior Art

A lithographic plate of the kind used for printing newspapers and the like takes the form of a thin aluminium sheet having a thickness of the order of 0.3 mm and having one or both end regions thereof folded over to lie at approximately 30° to the plane of the sheet. To transport the plates from one process station to another within the printing works, the plates are carried by horizontal and overhead conveyors and apparatus is provided for transferring the plates from the horizontal conveyor to the overhead conveyor.

A known apparatus for transferring a lithographic plate from a horizontal conveyor to an overhead conveyor is shown in FIG. 5 of the accompanying drawings. The form of the lithographic plate itself is illustrated in FIGS. 6 and 7, where a turned over end region of the plate S is indicated by the reference S1.

As indicated in FIG. 5, the lithographic plate S is conveyed longitudinally on a horizontal conveyor 30 from one process station and is delivered onto an input conveyor 30' at the input of an apparatus for transferring the lithographic plate to a selected one of a plurality of overhead conveyors 34. The input conveyor is intermittently operated in synchronism with pairs of opposed hooks (not shown) carried by a plate elevating means of the transferring apparatus in the form of a pair of spaced apart endless chains 40 arranged to be driven in both directions.

The input conveyor 30' feeds the lithographic plate S onto a rotatable orientating means 32 which orients the lithographic plate S for conveyance either by the left hand or right hand run of the elevating means 40. The plate S is then picked up by a pair of hooks on the chains engaging the turned over end portion S1 of the plate and the plate is conveyed upwardly supported on the hooks until the plate reaches a position slightly above a selected movable plate bed 44. While the plate is being conveyed upwardly from the orientating means 32, the plate bed 44 is located in a standby position indicated at A. Once the plate S has been conveyed to the position slightly above the plate bed 44, the plate bed is moved transversely of the chains 40 to the loading position indicated at B and the chains 40 are driven downwardly to deposit the lithographic plate onto the plate bed 44 which then moves to a transfer position C in which the upper end of the lithographic plate S is presented to an overhead conveyor 34 which picks the plate from the bed 44 and carries it towards another process station.

A known plate transferring apparatus as described above is complicated in construction because the plate bed 44 must be movable transversely of the conveying chains 40 and, in addition, the reciprocating motion of the chains 40 and the plate bed 44 causes the lithographic plates to swing, possibly resulting in an unstable transfer and restricting the reliability and handling capacity of the apparatus.

SUMMARY OF THE INVENTION

The present invention aims to provide an apparatus for transferring a lithographic plate which avoids the need for reciprocating movement of the plate advancing means and the plate bed.

Accordingly, the invention provides an apparatus for transferring a lithographic plate from a horizontal conveyor to an overhead conveyor, which apparatus comprises elevating means driven in one direction around an endless vertical path and having a pair of hooks for engaging a folded end portion of a lithographic plate at spaced apart locations to support the lithographic plate for movement with the elevating means, an obliquely disposed plate bed adjacent a descending portion of the endless vertical path of the elevating means for receiving and retaining the plate as it descends with the elevating means, and means for guiding the hooks laterally outwardly of the lithographic plate as the plate is deposited on the plate bed.

BRIEF DESCRIPTION OF THE DRAWINGS

In order that the invention may be more readily understood, the invention will now be described, by way of example, with reference to the accompanying drawings, in which:

FIG. 1 is a front view of a lithographic plate transferring apparatus embodying the present invention;

FIG. 2 is a view of the apparatus of FIG. 1 from the right hand side;

DETAILED DESCRIPTION OF THE PREFERRED EMBODIMENTS

Figure 3:
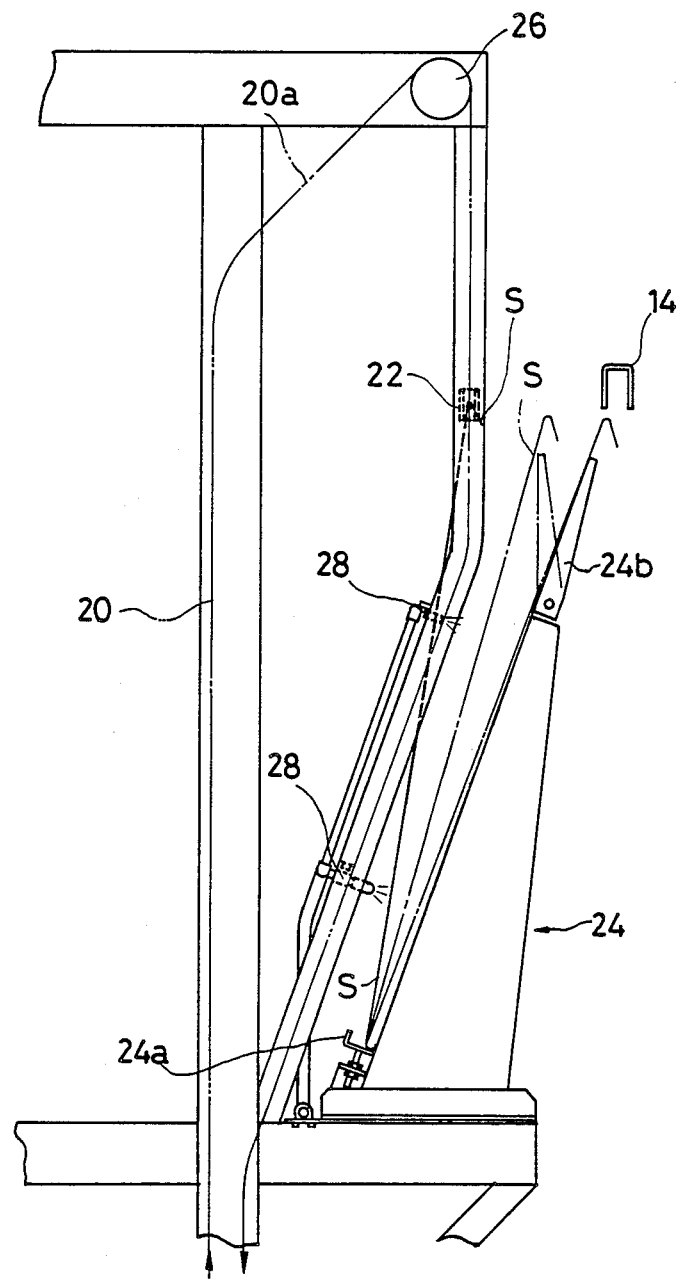
FIG. 3 is an enlarged front view of an upper portion of the apparatus of FIG. 1.
Figure 4:
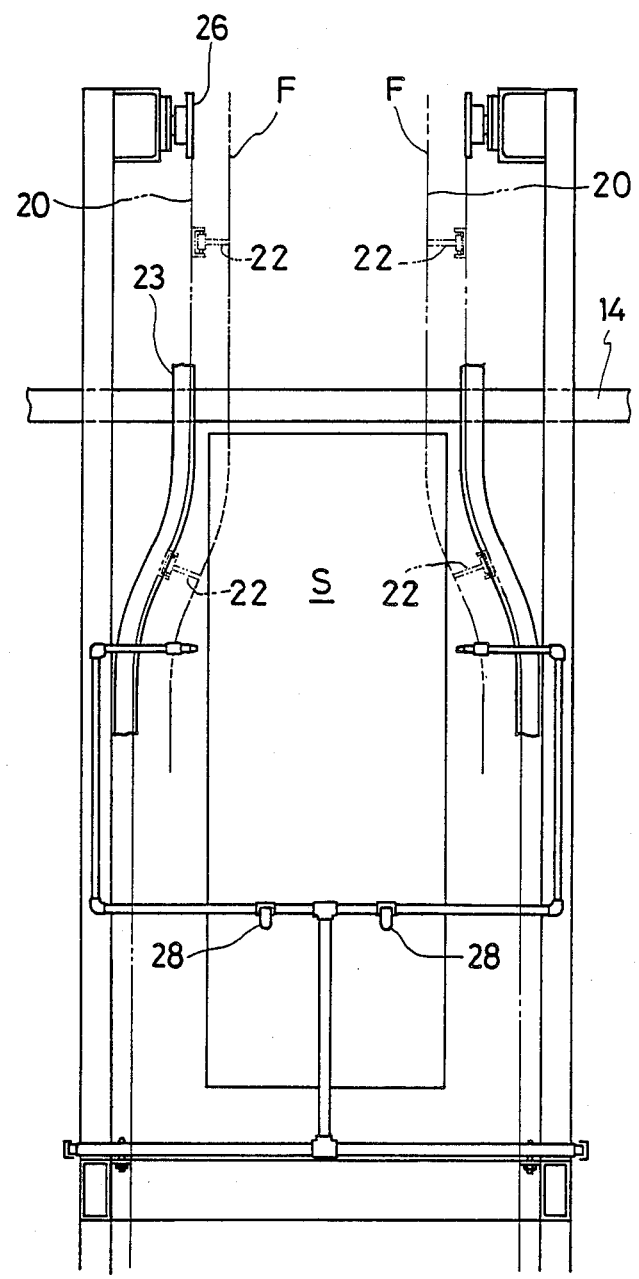
FIG. 4 is an enlarged view of an upper part of the apparatus of FIG. 1 from the left hand side.
Figure 5:
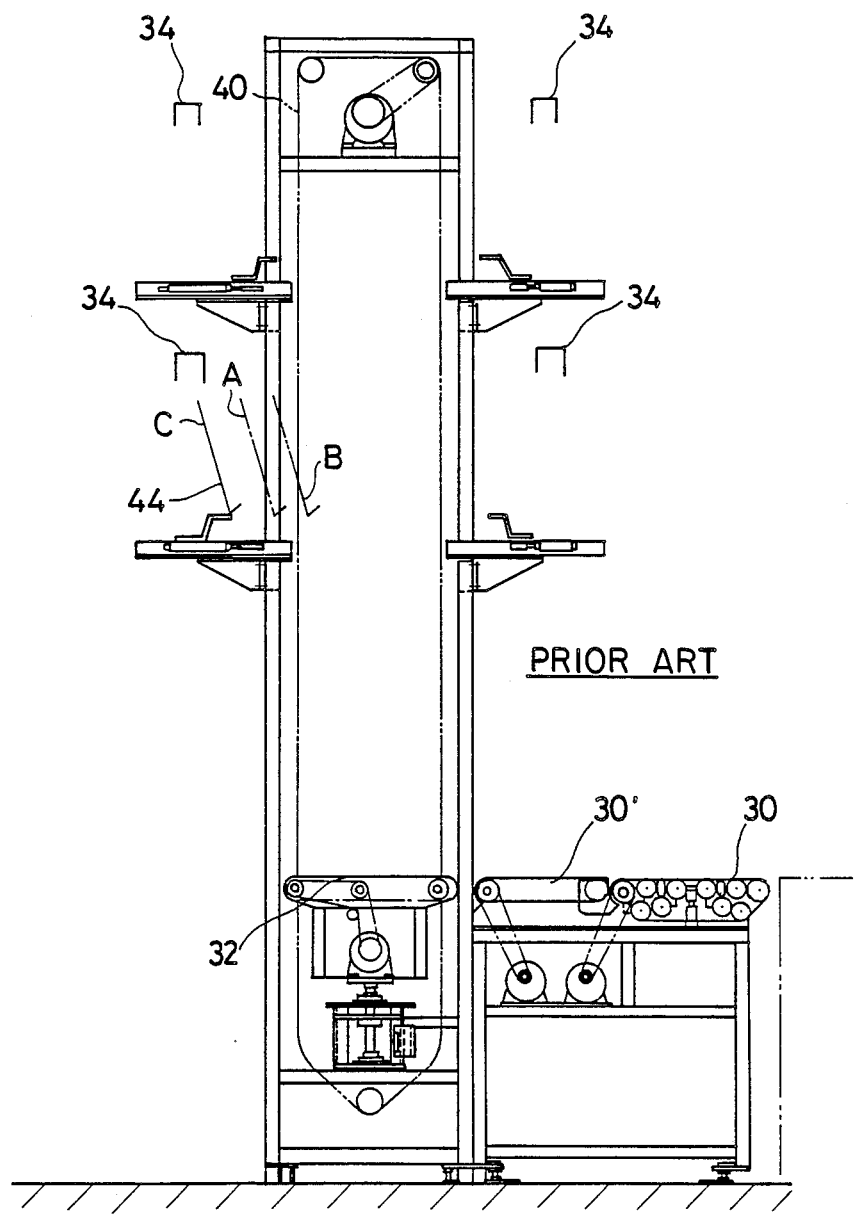
FIG. 5 is a front view of a known lithographic plate transferring apparatus according to the prior art.
Figure 6:
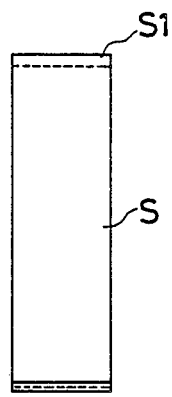
FIG. 6 is a front view of a lithographic plate with which the plate transferring apparatus is used.
Figure 7:
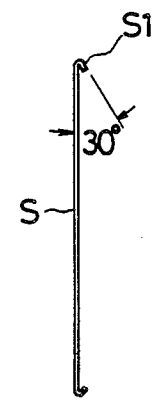
FIG. 7 is a side view of the lithographic plate of FIG. 6.

Referring initially to FIGS. 1 and 2 of the accompanying drawings, a lithographic plate transferring apparatus 16 embodying the present invention serves to transfer a lithographic plate S from a horizontal belt conveyor 10 for conveying the plate from one process station to a selected one of a pair of overhead conveyors 14 for conveying the plate S to another process station.

The conveyor 10 delivers the lithographic plate S to orienting means 12 in the form of a rotatable platform which is operated in synchronism with the plate transferring apparatus 16 and which swings the plate S through 90° from the orientation in which it is conveyed by conveyor 10 in order to present the plate S to the apparatus 16 in a desired orientation.

The apparatus 16 has symmetrical righthand and lefthand parts as seen in FIG. 1 and comprises a vertically extending framework 17 supporting lefthand and righthand elevating means 19 and lefthand and righthand plate beds 24. The lithographic plate S is introduced into the transferring apparatus 16 from the orienting means 12 by an input conveyor 13.

Each elevating means 19 comprises a pair of vertically disposed spaced apart endless chains 20, (see FIG. 2) which are driven continuously in the same direction around an endless vertical path by a motor 18 and which carry pairs of opposed hooks 22 for engaging the folded upper end portion S1 of a lithographic plate S presented on the introducing conveyor 13 in order to support the plate between the pair of chains 20 so as to lift the plate from the input conveyor 13 and carry the plate along the endless vertical path followed by the chains 20. An upper portion of the path of the chains forms a loop 20a around upper sprockets 26 and has a descending portion adjacent which is disposed on obliquely extending plate bed 24 supported on a platform 21 of the framework 17 clear of the upward run of the chains 20. The plate bed 24 is disposed alongside inclined guide rails 23 which guide the chains 20 over a portion of their downward movement, so that the chains are guided apart to cause a local increase in the spacing between the chains, the guide rails allowing the chains to return to their original spacing beneath the plate bed 24.

As shown in FIG. 3, plate bed 24 is slightly shorter than the lithographic plate S and has a stop flange 24a along its lower edge. A pivotable portion 24b is provided at an upper edge of the plate bed 24. The pivotable plate bed portion 24b is movable between a transfer position which is shown in full lines in FIG. 3 and in which the portion 24b is aligned with the rest of the plate bed 24 and a plate receiving position which is shown in chain lines in FIG. 3 and in which the portion 24 is inclined inwardly relative to the rest of the plate bed towards the chain 20.

Two pairs of air nozzles 28 are positioned inwardly of the path of the chain 20 opposite the plate bed 24 to direct jets of air onto the plate bed.

In operation of the apparatus 16, a lithographic plate S delivered onto the orienting means 12 by the horizontal conveyor 10 is oriented by the means 12 so that the turned over end portion of the plate S is positioned at either the leading or trailing end of the plate and is fed in this orientation onto the input conveyor 13.

The lithographic plate S remains on the input conveyor until the turned over portion of the plate is engaged by a pair of hooks 22 travelling with the pair of chains of either the lefthand or righthand elevating means 19. Which pair of hooks engage the plate S will depend upon whether the turned over portion of the plate is located at the leading or trailing end of the plate as fed onto the input conveyor.

Upon a pair of hooks 22 engaging the plate S, the plate is lifted and carried upwardly by the chains 20, supported between the spaced apart hooks 22.

The hooks carried by the chains 20 eventually pass over the top sprockets 26 of the elevating means and the hooks then start to follow a downward path indicated at F in FIG. 3 and defined by the movement of the chains 20 as guided by the guide rails 23. During this downward movement, the bottom edge of the lithographic plate S comes to rest against the stop flange 24a of the plate bed 24 and is urged against the plate bed by the jets of air from the air nozzles 28. At this time, the pivotable portion 24b of the plate bed is in its inwardly inclined position.

As the chains 20 continue to descend, the pair of hooks are disengaged from the turned over upper edge of the lithographic plate. Once disengaged from the edge S1, the hooks 22 are guided apart as a result of the chains 20 following the diverging paths defined by the guide rails 23, so that the hooks clear the longitudinal edges of the plate and allow the plate to be pressed against the plate bed in a stable condition by the air pressure from the nozzles 28.

After the hooks have been disengaged from the lithographic plate S, the pivotable portion 24b of the plate bed is returned to its transfer position in which the lithographic plate is presented to an adjacent overhead conveyor 14 which picks the plate S up from the plate bed 24 and conveys it to another processing station.

The above arrangement means that the plate bed 24 need not be moved laterally as in the prior art apparatus described hereinbefore, but is fixed in position on an upper portion of the framework 17 of the apparatus.

In addition, the chains 20 of the elevating means are only required to move in one direction. Therefore, unlike the prior art apparatus, a lithographic plate can be transferred from the horizontal conveyor to a plate bed without the need to reverse the direction of movement of the chains in order to deposit the lithographic plate on the plate bed. Thus, less swinging movement of the lithographic plate occurs during transfer to the plate bed and the lithographic plate is stably located on the plate bed and accurately presented to the overhead conveyor to which the lithographic plate is to be transferred for conveyance to another processing station.

I claim:

1. Apparatus for transferring a lithographic plate (S) from a horizontal conveyor (10) to an overhead conveyor (14), comprising:
    elevating means (19) continuously driven in one direction around an endless vertical path and having a pair of hooks (22) for engaging a folded end portion (S1) of the lithographic plate at laterally spaced locations to support the lithographic plate between said hooks for movement with the elevating means;
    an obliquely disposed plate bed (24) adjacent a descending portion along a path of the elevating means for receiving the plate as it descends with the elevating means, the path being obliquely disposed adjacent the plate bed; and,
    means (23) adjacent the plate bed for guiding the hooks laterally outwardly of the lithographic plate as the hooks descend along the obliquely disposed path, thereby releasing said lithographic plate and depositing the plate on the plate bed.

2. Apparatus according to claim 1, wherein the plate bed has an upper pivotable portion (24b) movable between a first position for receiving the lithographic plate from the elevating means and a second position presenting the lithographic plate to the overhead conveyor.

3. Apparatus according to claim 1, comprising means (28) for directing a jet of air onto a lithographic plate supported by the plate bed.

4. Apparatus according to claim 1, wherein the elevating means comprises a pair of vertically disposed endless chains (20) for supporting the lithographic plate therebetween.

5. Apparatus according to claim 4, wherein the guiding means comprises a pair of diverging guide rails (23) guiding the chains over a portion of their path of movement.

6. Apparatus according to claim 1, comprising, an orienting means presenting the plate to the apparatus in one of two orientations, and two elevating means for selectively engaging the lithographic plate in dependence upon the orientation of the plate as presented to the apparatus and for transferring the plate to said plate bed for presenting the plate to an overhead conveyor.

* * * * *